(12) United States Patent
Bao et al.

(10) Patent No.: US 6,736,985 B1
(45) Date of Patent: May 18, 2004

(54) HIGH-RESOLUTION METHOD FOR PATTERNING A SUBSTRATE WITH MICRO-PRINTING

(75) Inventors: Zhenan Bao, North Plainfield, NJ (US); Anita Makhjita, Edison, NJ (US); John A. Rogers, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/305,722

(22) Filed: May 5, 1999

(51) Int. Cl.$^7$ ............................................... H01L 21/00
(52) U.S. Cl. ............................ 216/13; 216/41; 216/49; 216/54; 216/100; 438/99
(58) Field of Search ........................... 216/8, 9, 10, 13, 216/37, 41, 49, 54, 100; 438/99

(56) References Cited

U.S. PATENT DOCUMENTS

| | | | | |
|---|---|---|---|---|
| 2,099,697 | A | * 11/1937 | Marshall | 216/54 |
| 4,126,511 | A | * 11/1978 | Ford | 216/54 |
| 4,752,353 | A | * 6/1988 | Blanding et al. | 216/54 |
| 4,959,120 | A | * 9/1990 | Wilson | 216/54 |
| 5,259,926 | A | * 11/1993 | Kuwabara et al. | 216/49 |
| 5,499,731 | A | * 3/1996 | Marshall | 216/49 |
| 5,512,131 | A | * 4/1996 | Kumar et al. | 156/655.1 |
| 5,574,291 | A | * 11/1996 | Dodabalapur et al. | 257/289 |
| 5,612,228 | A | * 3/1997 | Shieh et al. | 257/40 |
| 5,725,788 | A | * 3/1998 | Maracas et al. | 216/47 |
| 5,817,242 | A | * 10/1998 | Biebuyck et al. | 216/54 |
| 5,900,160 | A | * 5/1999 | Whitesides et al. | 216/41 |
| 5,925,259 | A | * 7/1999 | Biebuyck et al. | 216/2 |
| 6,060,338 | A | * 5/2000 | Tanaka et al. | 257/40 |
| 6,335,539 | B1 | * 1/2002 | Dimitrakopoulos et al. | 257/40 |
| 2002/0045289 | A1 | * 10/2001 | Dimitrakopoulos et al. | 438/99 |

OTHER PUBLICATIONS

Xia, Younan et al, Pattern transfer: Self–assembled monolayers as ultrathin resists, Microelectronic Engineering, 1996, Elsevier, vol. 32, pp. 255–268.*

Xia, Y. et al, Advanced Materials, "Microcontact Printing with a Cylindrical Rolling Stamp: A Practical Step Toward Automatic Manufacturing of Patterns with Submicrometer–Sized Features" 8 (12) 1015–1017, Dec. 1996.*

Xia et al.; "Microcontact Printing with a Cylindrical Rolling Stamp: A Practical Step Toward Automatic Manufacturing of Patterns with Submicrometer–Sized Features"; *Advanced Materials* vol. 8 No. 12, dated: 1996; pp. 1015–1016.

Kumar et al.; "Features of Gold Having Micrometer to Centimeter Dimensions Can be Formed Through a Combination of Stamping With an Elastomeric Stamp and an Alkanethiol "Ink" Followed by Chemical Etching"; *American Institute of Physics, Appl. Phys. Lett. 63 (14)*; dated: Oct. 4, 1993; pp. 2002–2004.

* cited by examiner

*Primary Examiner*—Anita Alanko
(74) *Attorney, Agent, or Firm*—Lowenstein Sandler PC

(57) ABSTRACT

A method is disclosed for producing a high-resolution patterned layer on a substrate for use in making electronic devices. The method comprises micro-printing an inked pattern on a substrate with use of a rotatable stamp; passing the substrate to an apparatus for etching or depositing materials on the substrate, where the inked pattern guides the etching or deposition of material; and then optionally removing the inked pattern from the substrate with the application of heat, ultraviolet light, or wet chemical means. A high-quality transistor with a 2-micron channel length may be fabricated using the inventive method. The method is compatible with rapid, reel-to-reel patterning and useful for a range of applications.

10 Claims, 7 Drawing Sheets

HIGH-RESOLUTION METHOD FOR PATTERNING A SUBSTRATE WITH MICRO-PRINTING

FIELD OF THE INVENTION

This invention relates to a method of patterning a substrate with a micro-printing providing high resolution and to electronic devices, particularly transistors, made with the inventive method.

BACKGROUND OF THE INVENTION

Demands for low-cost consumer electronics (e.g. large emissive displays, electronic paper, smart cards, and so forth) have precipitated the development of organic materials suitable for use as conducting, semiconducting, and light-emitting materials. Organic materials are attractive for use in electronic devices as they are compatible with plastics and can be easily fabricated to provide low-cost, lightweight, and flexible devices with plastic substrates. Organic materials having a conductivity and carrier mobility permitting their use as the active layer in thin-film semiconductor devices are described in U.S. patent application Ser. No. 08/770,535, filed Dec. 20, 1996, "Method of Making An Organic Thin Film Transistor," by Zhenan Bao et al. (an inventor herein), also assigned to the present assignee and incorporated herein by reference. An organic device is described in U.S. patent application Ser. No. 09/087,201, filed May 29, 1998, "Thin-Film Transistor Monolithocally Integrated With an Organic Light-Emitting Diode," by Zhenan Bao et al. (an inventor herein), which is assigned to the present assignee and incorporated herein by reference. The '201 application discloses a light emitting diode (LED) having an organic layer as the active layer and a transistor having an organic layer as the semiconductor layer, where the LED and transistor are monolithocally integrated.

Recently, research related to organic materials in electronic devices has expanded to encompass patterning methods that take advantage of the ease with which these materials may be processed. For example, photolithography may be used to pattern organic materials, as described in C. J. Drury et al., APPL. PHYS. LETT. Vol. 73 (1998), at p. 108.

Unconventional, non-photolithographic methods are being explored which provide advantages in terms of cost and flexibility in fabricating semiconductor devices generally. Such techniques include ink jet printing and screen printing which are described in Z. Bao (an inventor herein) et al, "High Performance Plastic Transistors Fabricated by Printing Techniques," CHEM. MATER, Vol. 9 (1997), at p. 1299. These non-conventional techniques are suitable for use in a range of fabrication tasks that provide resolution at ~35–100 $\mu$m and larger. However, these methods may not be useful for making organic semiconductor devices. For instance, a technique for imprinting patterns on silicon substrates with features having dimensions of 10 to 80 $\mu$m using a planar elastomeric stamp has been disclosed, but this technique is not applicable to organic devices. See Kumar and Whitesides, "Features of Gold Having Micrometer to Centimeter Dimensions Can Be Formed Through a Combination of Stamping with an Elastomeric Stamp and an Alkanethiol 'Ink' Followed by Chemical Etching," APPL. PHYS. LETT. Vol. 63 (1993), at p. 2002, incorporated herein by reference.

Additionally, the critical dimensions (typically transistor channel lengths) desired for many applications is as low as about 10 $\mu$m. Planar stamps are of limited use due to air bubbles that become trapped between the stamp and the substrate. Use of a cylindrical rolling elastomeric stamp is disclosed in Xia, Qin, and Whitesides, "Microcontact Printing With a Cylindrical Rolling Stamp: A Practical Step Toward Automatic Manufacturing of Patterns with Submicrometer-Sized Features," ADV. MATER. Vol. No. 12 (1996), at p. 1015, incorporated herein by reference. Microcontact printing to print SAMS patterns is further described in D. Qin, Y. Xia, J. A. Rogers (an inventor herein), et al., "Microfabrication, Microstructures and Microsystems," TOPICS IN CURRENT CHEMISTRY (1998), at pp. 1–20, which is incorporated herein by reference. These methods do not provide structures that are immediately useful in making organic semiconductor devices. The method described in the Advanced Materials publication does not allow for continuous printing and provides only a single impression from lip the patterned stamp.

A fabrication strategy has been recently developed to obtain high resolution devices. This strategy involves a combined micromolding/screen-printing strategy, i.e., this strategy combines an emerging high-resolution technique (micromolding in capillaries) for defining critical features and an established low-resolution method (screen printing) for patterning other elements of the devices. See, e.g., J. A. Rogers, Z. Bao (inventors herein) and V. R. Raju, APPL. PHYS. LETT. Vol. 71 (1998), at p. 2716. With this strategy, organic transistors are produced with channel lengths approximately fifty times smaller (~2 microns) than those previously achieved with other non-photolithographic schemes, providing a resolution exceeding the requirements for most applications. However, the micromolding can be relatively slow (~30 minutes may be needed to pattern a substrate). Also, it is not compatible with reel-to-reel processing or readily applied to construct dense, non-interconnected circuitry.

As may be appreciated, those concerned with technologies involving electronics devices or systems continue to search for new methods of patterning substrates to enable faster and more flexible processing of the materials to provide less-expensive and improved devices. In particular, it would be advantageous to provide improved high-resolution patterning techniques that are useful in making organic devices that are low in cost and applicable to fabricate dense, non-interconnected circuitry. This invention provides these advantages.

SUMMARY OF THE INVENTION

Summarily described, the invention embraces a method for patterning a layer of material on a substrate at high resolution that is useful in making electronic devices, including organic electronic devices. The method comprises a step of providing a rotatable stamp having relief geometries on its surface that advantageously may comprise a cylindrical stamp mounted on an axle. Ink is applied to the surface of the stamp, preferably with a cylindrical inking pad to provide substantially continuous inking of the stamp. The cylindrical stamp is rolled against a substrate, which preferably is provided in the form of a sheet of material, so that an inked pattern is impressed on the substrate. The substrate is then passed to an apparatus for etching material from or depositing material on the substrate. The inked pattern on the substrate guides the etching or deposition of material to form a patterned layer. The substrate optionally may be sent to a mechanism for removing the inked pattern from the substrate, which may comprise exposing the substrate to UV light, heat, or a wet chemical means.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and except for the graphs are not to scale.

DETAILED DESCRIPTION OF THE INVENTION

With this invention, a method is described for patterning a layer of material on a substrate at high resolution that is useful in making electronic devices, including organic electronic devices. The method may be used to fabricate many electronic devices, such as LEDs, diodes, capacitors, inductors and so forth. Although it is described below with reference to the fabrication of transistors, and particularly organic transistors, it should be understood that the discussion of organic transistors is exemplary only and that the invention may be applied in the fabrication of any electronic device where a layer of material is to be patterned.

The inventive method uses microcontact printing and an "upside-down" fabrication sequence to produce electronic devices. Elastomeric stamps and inks may be used to print patterns of self assembled monolayers (SAMS) onto a substrate, and the SAMS are then used to guide the deposition of material onto the substrate or prevent etching of material from the substrate to define a pattern. An advantage of this invention is that the inked pattern may be removed and in any case, it need not be incorporated as a functional material in the device being fabricated. Thus, the properties of the ink with regard to its function within the device are not critical, and the ink properties can be optimized for printing.

With this method, microcontact printing first patterns a layer on a substrate, with which a resolution can be achieved of ~1 micron. In the case of fabricating a transistor, the patterned layer may form source and drain electrodes and appropriate interconnections. The remaining components of the device (e.g., semiconductor layer, interlayer dielectric and gate electrodes) may be patterned on top of the high-resolution patterned layer (e.g., source and drain electrodes) using low resolution techniques. To form an organic device, one or more layers of the device (e.g., the semiconductor layer or active layer), may be comprised of an organic material. This is an "upside down" fabrication sequence. For example, typically in fabricating a transistor, a "rightside-up" sequence is used where formation of source and drain electrodes occurs on top of dielectric and gate layers. The inventive method may be applied for rapid, large volume reel-to-reel processing providing a cost-effective process for making microelectronics.

Figure 1:
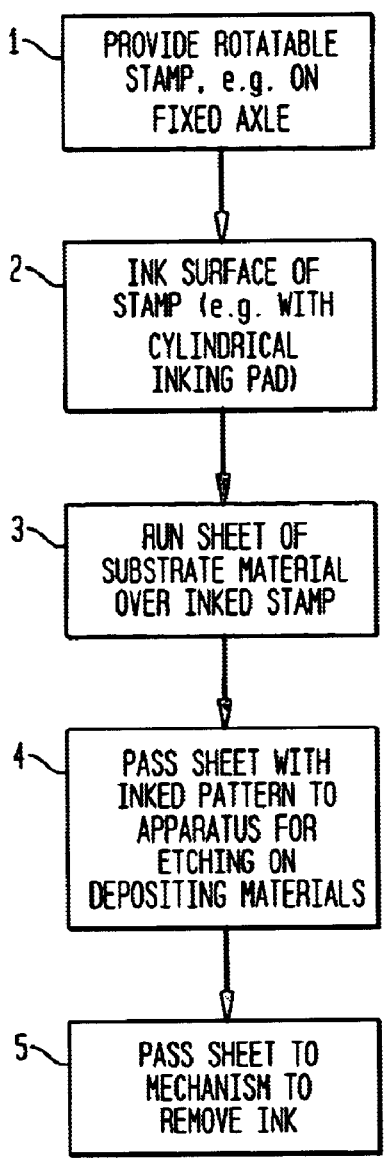
FIG. 1 is a block diagram of steps of the inventive method.

With reference to the figures, FIG. 1 reflects a block diagram listing steps of one embodiment of the inventive method, and FIGS. 2A–2D reflect an illustration of a substrate as it is being patterned: As can be seen, an initial step includes providing a stamp 10 for making a pattern (FIG. 1, block 1). The stamp is configured so that its outer surface may be rolled against the substrate in a substantially continuous (e.g., uninterrupted) fashion, and for ease of reference, the term "rotatable" shall be used herein to refer to the stamp having this outer geometry. The rotatable stamp may take many shapes and sizes, although preferably, it comprises a cylindrical stamp mounted on an axle 38, preferably a fixed axle. The outer surface of the stamp also has relief geometries (protrusions or recesses) to define a stamping surface 8. Next, the surface of the stamp (FIG. 2A) is inked, e.g., an alkanethiol or alkylsiloxane ink or other suitable inking material is applied to the outer surface, particularly the relief geometries. For example, an elastomeric stamp fabricated with polydimethylsiloxane may be contacted with ~1 mM hexadecanethiol in ethanol to "ink" the stamp. This step preferably is accomplished by rotating a cylindrical inking pad against a cylindrical stamp (FIG. 1, block 2, and FIG. 7), to allow for substantially continuous rotary printing.

Figure 2A:
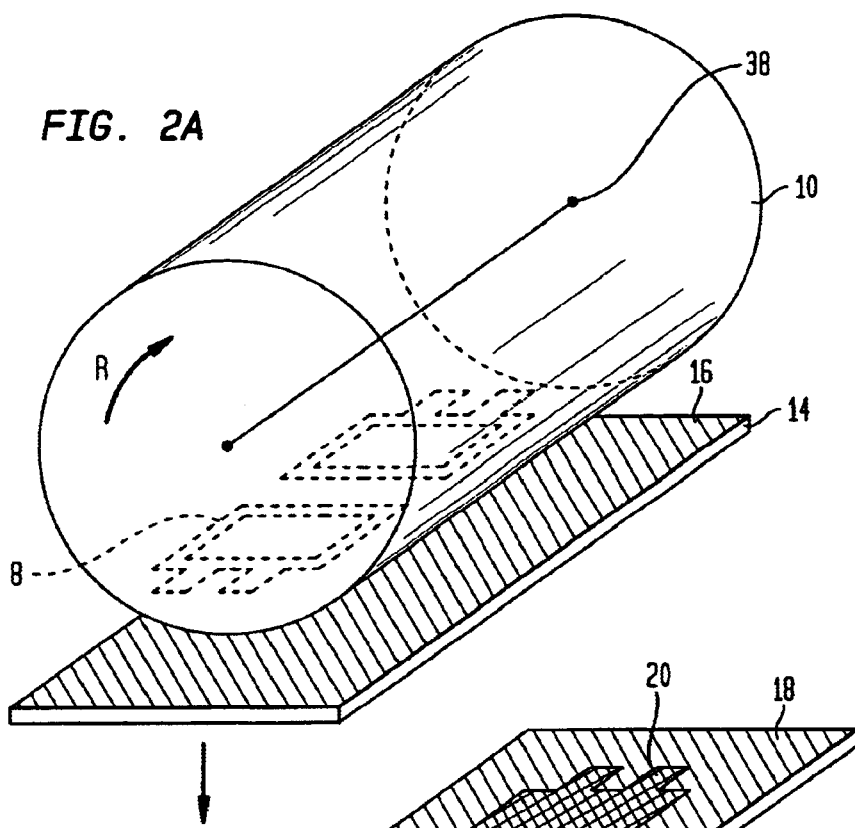
FIGS. 2A–2D schematically illustrate a substrate being patterned applying steps of the inventive method.
Figure 2B:
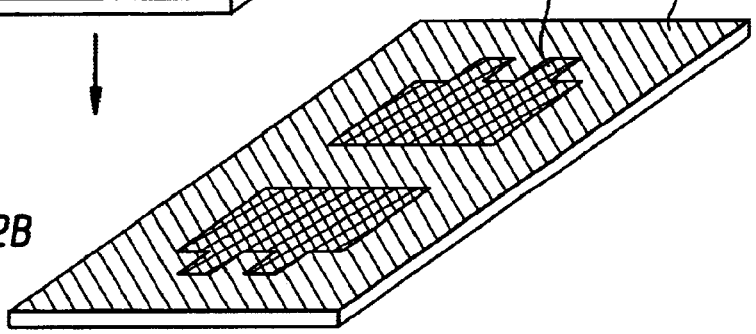

As shown in FIG. 2A, a substrate 14 to be patterned is provided, which may, for example, comprise a silicon, plastic, or glass substrate. The active side of the substrate (the surface at which components will be disposed) may be coated with a thin layer of conductive material 16, for example, for providing source and drain electrodes. Preferably with this method, the conductive layer 16 comprises a thin layer of gold or silver (e.g., $<$~300 Å, and more preferably ~200 Å). A thin layer of an adhesive-promoting material, such as a ~10–20 Å layer of Ti or Cr, also may be applied to promote adhesion. Advantageously the substrate is provided in the form of a flexible sheet of material, i.e., having sufficient flexibility so that it can be wound on a reel and passed through the steps of the method as the sheet is unwound from the reel. More preferably the sheet is suspended on two reels and is unwound from one reel as it is wound onto the other to provide a reel-to-reel printing technique. In this embodiment, the stamp is disposed between the two reels, and the sheet may be placed in contact with the inked stamp substantially continuously applying the reel-to-reel technique. When the substrate is placed in contact with the inked stamp (FIG. 1, block 3), an inked pattern, e.g., a patterned self-assembled monolayer (SAW 20 is imprinted on the surface of the substrate 14 (FIG. 2B). The SAM defines a protected region 20 of the substrate, i.e., where ink is substantially disposed on the substrate. The remaining portions of the substrate surface define an exposed region 18 (FIG. 2B), i.e., where substantially no ink is present.

Next, the substrate (or sheet of substrate material) is passed to a processing apparatus (FIG. 1, block 4), and the inked pattern guides the etching or depositing of materials on the substrate. The SAM may serve as a guide for the deposition of further materials, such as insulating or conductive layers, in which case the sheet is passed to a materials deposition apparatus, such as a chamber for chemical vapor deposition. The processing apparatus may comprise an apparatus for performing crystal growth and epitaxy, film deposition (e.g., by chemical vapor deposition or sputtering), thermal evaporation, diffusion and ion implantation, wet chemical and dry etching, annealing, solution deposition, and so forth.

Figure 2C:
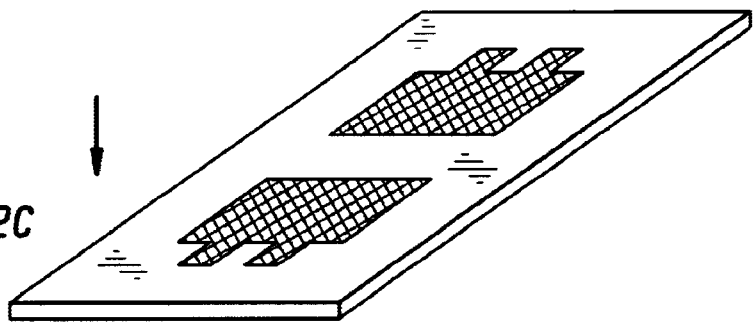
Figure 2D:
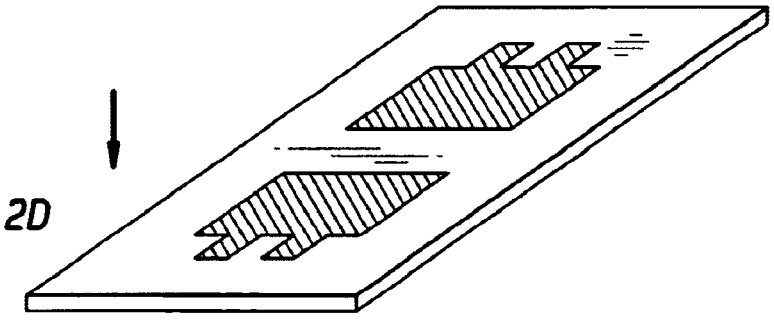

In the case of etching, the substrate may be sent to an etching bath or chamber for removal of the conductive layer 16 at the exposed region. An aqueous ferri/ferrocyanide etchant may be used for approximately three minutes to remove the metal layer 16 where it is not protected by the SAM that is, the exposed region of the metal layer is etched away (FIG. 2C). Where an adhesive-promoting layer is used, more than one etchant may be needed. For example, while an adhesive-promoting layer of Cr may be removed with the ferri/ferrocyanide etchant, a layer of Ti may require application of another etchant, e.g., HF etchant (~1% HF) applied for about 10 seconds. The sheet then may be exposed to heat or ultraviolet light to remove the SAM layer (FIG. 1, block 5), so that the underlying patterned conductive layer remains in a pattern on the substrate, e.g., to serve as drain or source electrodes (FIG. 2D). A wet chemical means alternatively may be applied to remove the SAM. This step enables good connections between the patterned layer and other components, e.g., with gold electrodes.

Advantageously one or more active layers, semiconductor layers, dielectric layers or gate electrodes are fabricated downstream of this process, which may aid in removing distortions introduced by reel-to-reel printing. Such layers may comprise organic materials for forming an organic electronic device. This "upside-down" procedure is advantageous because (i) it separates the metallization step from the rest of the process (e.g. metallized substrates may be obtained from an outside vendor), (ii) it avoids processing that requires high temperatures (>about 40° C.) or low pressures (<about 10 milliTorr), (iii) it allows registration of low resolution patterning steps to printed fiducials, thereby reducing the demands on distortions and registration of printed patterns, and (iv) it involves etching of the conductive layer (e.g., gold) before the remaining components (e.g., any organic components) of the final circuits are present.

Figure 1A:
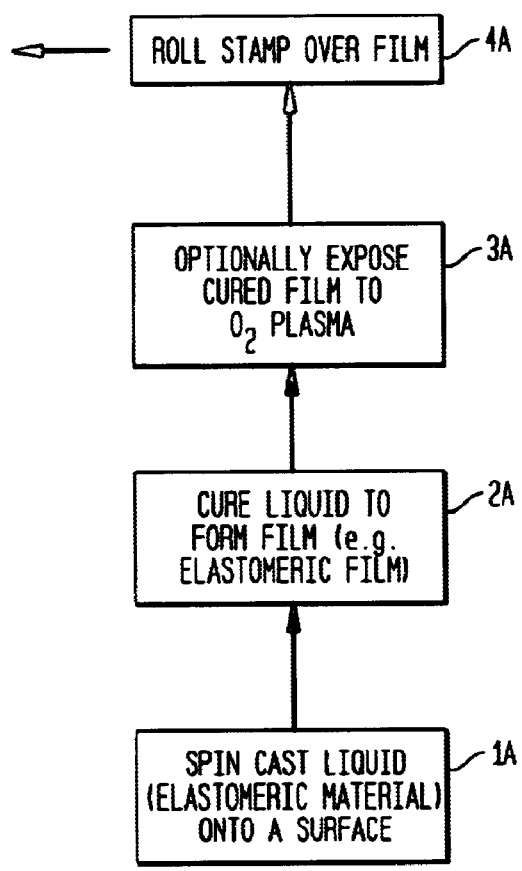
FIG. 1A is a block diagram of steps that may be applied to provide a cylindrical stamp used in performing the inventive method.
Figure 3A:
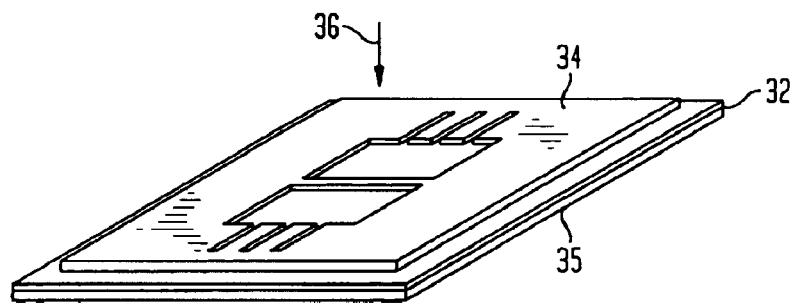
FIGS. 3A–3C are schematic illustrations of steps that may be applied in producing a cylindrical stamp.
Figure 3B:
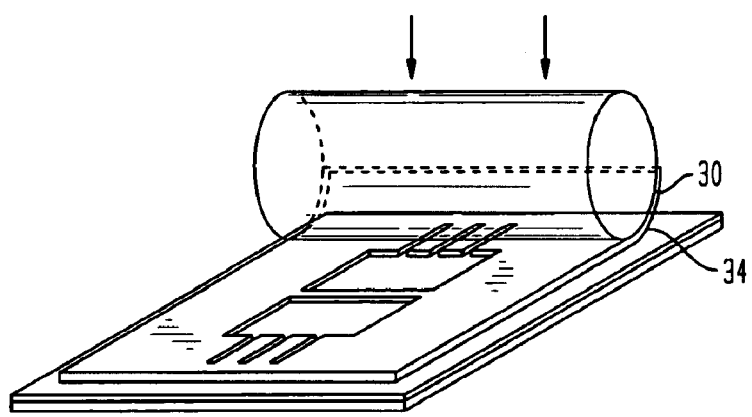

FIGS. 1A and 3A–3C show exemplary steps that may be applied to fabricate a cylindrical stamp. A liquid material 34 is cast onto a flat surface 35 having relief geometries 36 thereon. The liquid material may comprise a thin layer of elastomeric prepolymer 34, such as polydimethylsiloxane, which may be spin cast onto the flat surface (FIG. 1A, block 1A). A layer of photoresist 32 may be placed on the surface with the-relief geometries being defined in the photoresist layer, such as by photolithography. The liquid is solidified to define a solid film following the relief geometries 36 on the surface. When an elastomeric material is used, the elastomer may be cured against the photolithographically-patterned photoresist 32 to produce a thin elastomeric film following the relief in the geometry 36 of the resist (FIG. 1A, block 2A, FIG. 3A). Preferably, the cured film is exposed to an oxygen plasma (FIG. 1A, block 3A). Lastly, a cylinder 30, e.g., a glass cylinder, is rolled across the surface of the solid film so that the film is removed from the surface and bonds to the cylinder (FIG. 3B). Use of the oxygen plasma step is advantageous, as rolling the glass cylinder across the surface of the cured film after exposing it to an oxygen plasma produces a chemical bond between the surface of the glass and the elastomer and causes the elastomeric film to peel from the patterned resist (to which it has no adhesion). The condensation reaction bonds the elastomer to the glass cylinder.

Figure 3C:
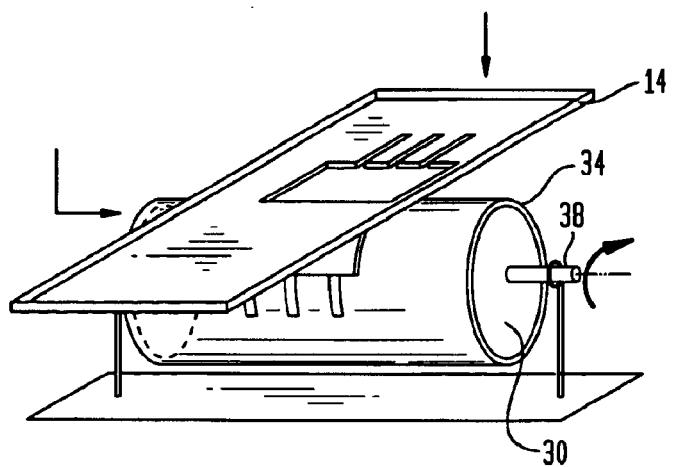

The cylinder may be mounted on an axle 38 and the substrate 14 (FIG. 2A) passed over or placed in contact with the cylinder for printing (FIG. 3C). When the method is performed using stamps fabricated in this manner, there are less distortions arising from deformations of the elastomeric stamps than with previous microprinting techniques. Distortions may be reduced to about <0.6 μm over areas ~1 cm² with stamps that consist of ~100 μm thick films of elastomer bound to rigid, flat glass substrates. This level of distortion substantially exceeds requirements (~10 μm) for most applications of organic electronics.

Preferably, in applying this technique inks of alkanethiols are used to define monolayer etch resists on surfaces of thin films of gold or silver. Under these conditions, features can be etched into the underlying thin films having high resolution, e.g., at ~30 nm or below. The patterning may be performed rapidly over relatively large areas, e.g., the stamp may come in contact with the surface being printed for less than about 0.5 seconds, areas of many square centimeters may be stamped simultaneously, and etching maybe completed within about 0.5 to 5 minutes, depending on the thickness of the metal. In the past, microcontact printing on gold or silver has not been used to produce low-cost electronic circuits because (i) gold and silver are incompatible with most materials and processing used in conventional microelectronics, (ii) only relatively thin layers (e.g. ~400 Å for Au, and ~1500 Å for Ag) may be patterned with these metals as the SAMS resists fail during prolonged etching, and (ii) printed surfaces of patterned metal layers are isolated from other layers or components of the device by the presence of the ink.

However, with this invention the ink is not functional within the device and may be removed. Also, applicants have discovered that, while the first two of these characteristics present serious disadvantages for conventional microelectronics, they provide significant advantages in making organic devices with the inventive method described herein. Gold, for example, is preferred for source and drain electrodes because it is chemically inert and allows excellent ohmic contacts with many organic materials useful for semiconductor layers. In addition, for geometries where the semiconductor layer is deposited on top of the source and drain electrodes, thin (<~300 Å) conductors are useful because they enable solution cast semiconductors (thickness ~50–200 nm) to uniformly, wet the edges of these electrodes. Use of thin metal conductors provide mechanical flexibility which is advantageous in applications using compliant plastic substrates. Such thin electrodes are also attractive from a cost standpoint. The sheet resistance of a thin (~200 Å) film of gold, ~3 Ω, is comparable to that of a 1000 Å layer of indium tin oxide, and it is much less than that of photoprocessable conducting polymers recently used in plastic integrated circuits.

For most applications, the semiconductors, dielectrics, and gate electrodes need to be patterned only on scales of about 30–100 microns. With the inventive method, these components may be deposited on the high-resolution components applying low resolution techniques. Removing the SAM as much as possible is advantageous in this fabrication sequence to provide devices exhibiting good performance, as the presence of the SAM may frustrate good ohmic contact of the semiconductor with the electrodes.

Figure 4A:
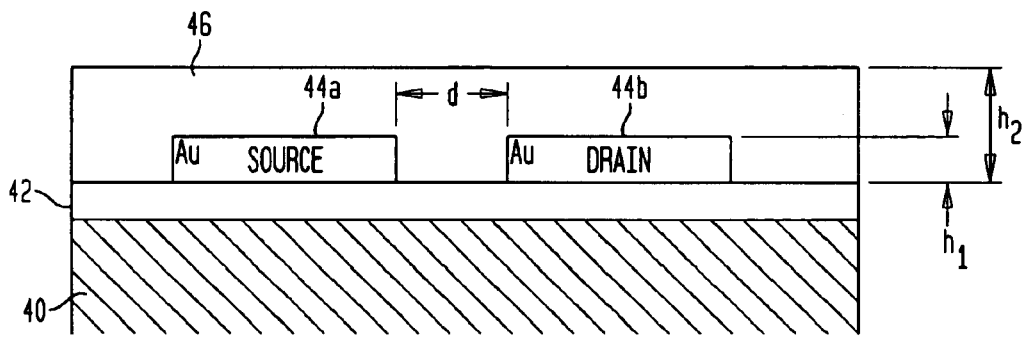
FIGS. 4A and 4B schematically illustrate alternative geometries of organic transistors fabricated with the inventive method.
Figure 4B:
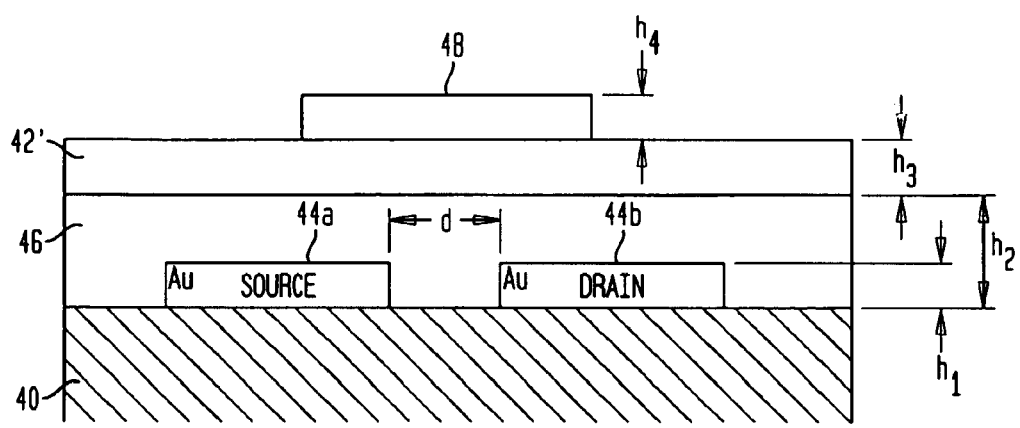

FIGS. 4A and 4B schematically show geometries of two types of organic transistors that were fabricated with the microcontact printing of this invention. FIG. 4A shows a geometry used to compare the performance of printed and photolithographically defined transistors, and FIG. 4B shows a geometry that incorporates materials and substrates compatible with low cost processing methods using a cylindrical stamp. Simple devices with geometries illustrated in FIG. 4A may be constructed by casting polythiophene from solution to form the active semiconductor layer. See Z. Bao, A. Dodabalapur and A. J. Lovinger, APPL. PHYS. LETT., Vol. 69 (1996), at p. 4108, incorporated herein.

In FIG. 4A, a doped Si layer is used as a substrate, with a ~300 nm layer of $SiO_2$ as an insulator 42. Source 44a and drain 44b electrodes fabricated with gold are formed on the insulating layer 42, separated by a distance "d" of about >1 μm, each having a height $h_1$ of about 20 nm. A semiconductor layer 46 is deposited over the source and drain electrodes, with the total height $h_2$ of the semiconductor layer being about 200 nm. In FIG. 4B, the substrate 40' is formed with glass, polyimide (PI) or polyethylene (PET). Source 44a and drain 44b electrodes are disposed on the substrate, again separated by a distance "d" of about >1 μm and each having a height $h_1$ of about 20 nm. A semiconductor layer 46, e.g., of regioregular poly(3-hexylthiophene) (PHT), is formed over the electrodes having a total height $h_2$ of about 200 nm. An insulating layer 42', e.g., of PI, poly(4-vinylphenyl), or polymethylmethacrylate (PMMA), is disposed over the semiconductor layer having a height $h_3$ of ~0.5 to 1 μm, with a gate 48 disposed thereon having a height $h_4$ ~of 1.0 to 50.0 μm.

Figure 5A:
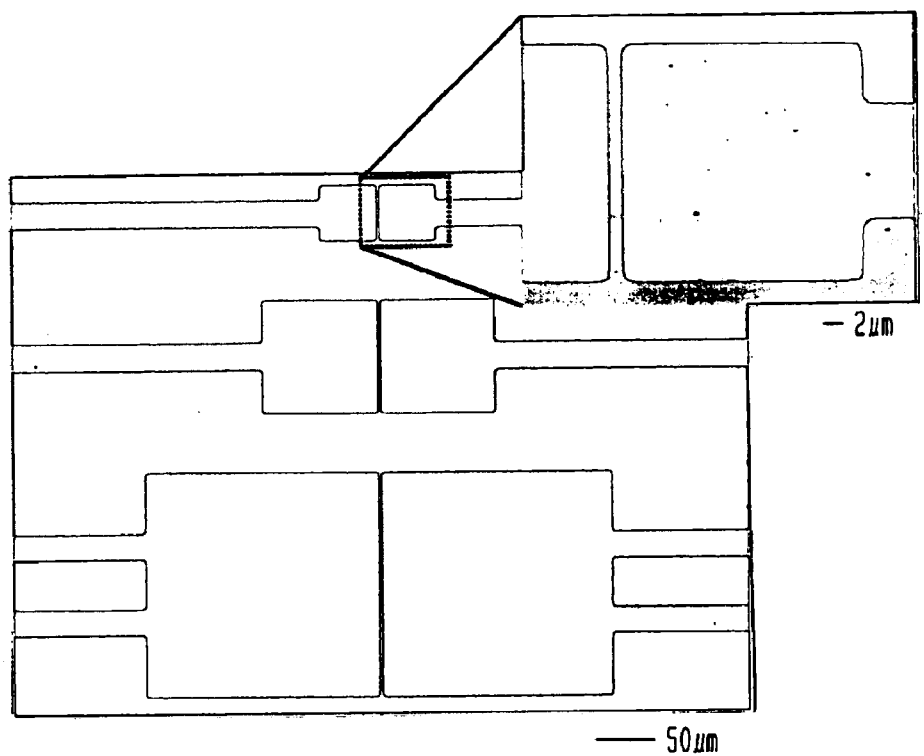
FIGS. 5A and 5B reflect optical micrographs of source and drain electrodes formed by printing (FIG. 5A) and photolithography (FIG. 5B)
Figure 5B:
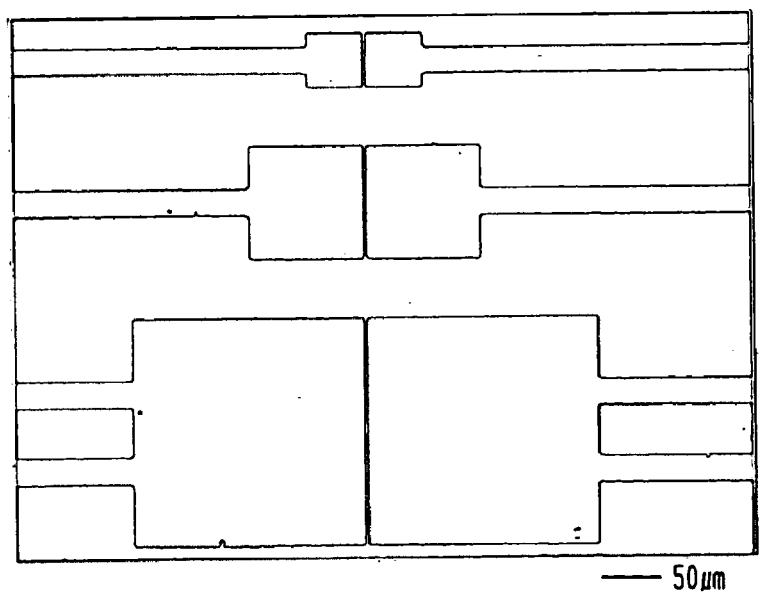
Figure 6A:
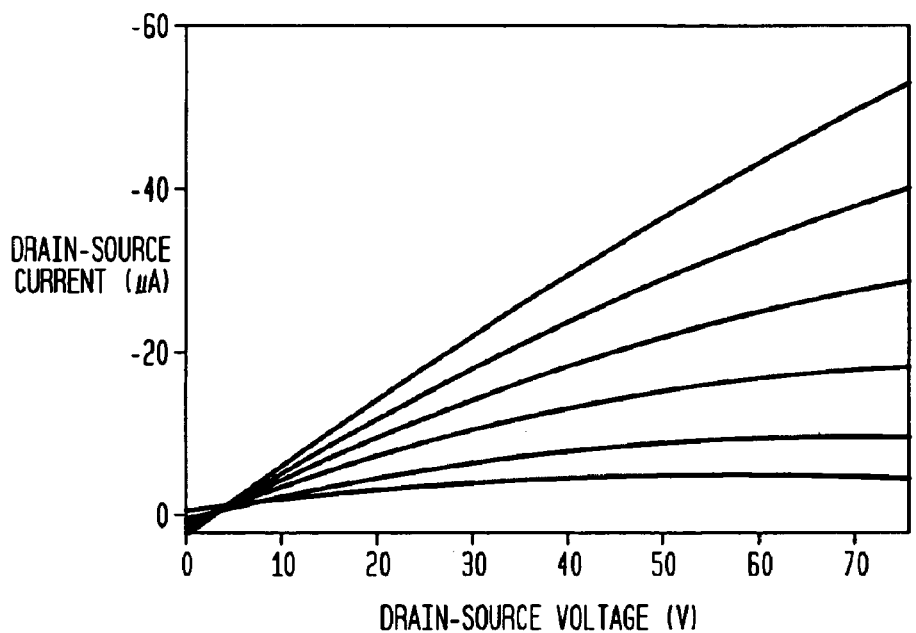
FIGS. 6A and 6B show current-voltage characteristics of printed transistors made with the inventive method having two channel length-to-width ratios that differ by a factor of two.
Figure 6B:
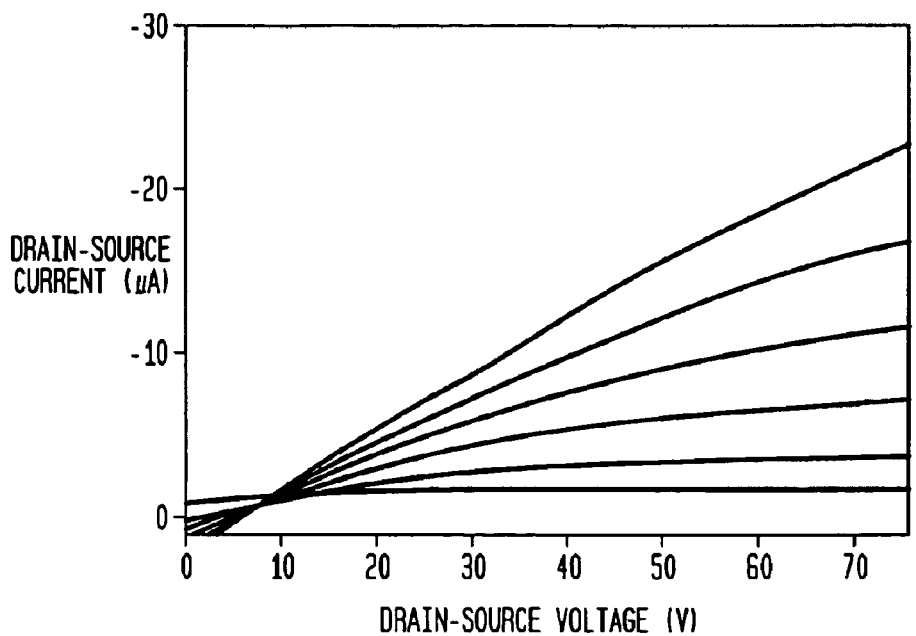

Comparing the characteristics of such devices to measurements on transistors with photolithographically-defined electrodes verify that these printed electrodes are suitable for organic transistors. FIGS. 5A and 5B are optical micrographs of source and drain electrodes, wherein the device of FIG. 5A was fabricated with microprinting applying the inventive method and the device of FIG. 5B was made with photolithography. In both cases, the slightly rounded edges are caused by the use of thick (~5 μm) photoresist. FIGS. 6A and 6B show current-voltage characteristics of printed transistors having two channel length-to-width ratios that differ by a factor of two.

Figure 7:
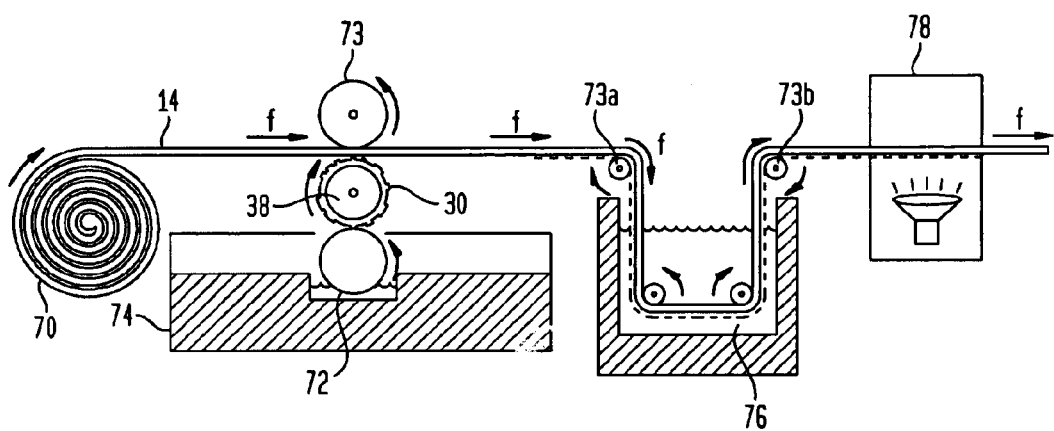
FIG. 7 schematically illustrates the inventive method in operation.

FIG. 7 shows an exemplary assembly for operation of the inventive patterning method with a reel-to-reel fabrication sequence. In this assembly, a coated substrate 14, e.g., a gold-coated plastic sheet, is transported through various processing steps. Advantageously rollers are used to move the sheet, although other devices are contemplated as well. The substrate is provided in the form of a sheet so that it may be wound one or more reels 70 and fed with movement of the reels through the processing. As the sheet is unwound from the reel and fed through the assembly (e.g., following arrows "f"), it is pressed against a cylindrical stamp 30 mounted on a fixed and rotating axle 38. The stamp 30 is continuously inked through contact with a cylindrical inking pad 72 (e.g., by continuous it is meant that the pad may be inked and the process performed over a period of time without interruption.) Patterned SAM resists are thereby defined on the sheet 14 with features as small as ~1 micron. The inking pad 72 is held in an ink reservoir 74, e.g., containing ~1 nM HDT/EtOH. A biasing cylinder 73 optionally may be oppositely disposed to the cylindrical stamp to help in pressing the sheet against the stamp and feeding the sheet through the assembly. The sheet is then continued to be fed through the assembly (e.g., with a plurality of rollers 73a, 73b), to an etching bath 76 to remove the exposed gold (e.g., the gold not covered by the SAM). The bath 76 may comprise 1 mM $K_4Fe(CN)_6$, 10 mM $K_3Fe(CN)_6$, 0.1 M $Na_2S_2O_3$, or 1.0 M KOH in $H_2O$. The etchant upon removing the exposed gold will leave a layer of conductive material on the sheet in a pattern corresponding to the geometry of the stamp. The sheet 14 is then fed to a chamber 78 for removal of the SAM, e.g., through exposure to UV light, heat, or wet chemical means, to complete the fabrication of the first conducting layer. Other components, such as semiconducting and dielectric layers and gate electrodes, can be defined on top of the gold circuitry using low resolution (35–100 μm) techniques (not shown) as are well-known in the field.

It is understood that the embodiments described herein are merely exemplary and that a person skilled in the art may make variations and modifications without departing from the spirit and scope of the invention. All such variations and modifications are intended to be included within the scope of the appended claims.

We claim:

1. A method for forming at making an organic transistor on a substrate comprising the steps of:

providing a substrate including a metal surface layer;

providing a rotatable stamp having relief geometries on its surface to define a stamping surface;

applying a self assembled monolayer ink to the surface of the rotatable stamp to define an inked stamping surface;

rotating the rotatable stamp on the metal surface layer as the layer is placed in contact with the stamp to impress on the layer an inked pattern as defined by the inked stamping surface; and patterning the layer by etching material from the layer wherein the inked stamping surface guides the etching in a geometry to define the patterned layer useful in fabricating an electronic device;

removing the inked pattern from the layer; and applying an organic semiconductor layer overlying the etched metal layer.

2. The method of claim 1, in which the step of providing the rotatable stamp comprises:

(a) casting a liquid onto a surface having relief geometries thereon;

(b) solidifying tho liquid to define a solid film; and (c) rolling a member over the solid film so that the solid film is lifted from the surface and bonds to the member.

3. The method of claim 2, in which the liquid comprises an elastomeric material, the step of solidifying the liquid comprises curing the elastomeric material to form an elastomeric film.

4. The method of claim 3, further comprising a step of exposing the cured elastomeric film to oxygen plasma before the member is rolled over the film.

5. The method of claim 1 in which the metal surface layer includes a thin layer of gold or silver.

6. The method of claim 1 in which the step of patterning the metal layer comprises etching material from the substrate applying an etchant selected from the group consisting of aqueous ferrocyanide, $K_4Fe(CN)_6$, $K_3Fe(CN)_6$, $Na_2S_2O_3$, and KOH in $H_2O$.

7. The method of claim 1, in which the step of rotating the stamp provides an exposed region the metal layer where substantially no ink is present and a protected region on the layer where ink substantially covers protected region.

8. The method of claim 1, in which the metal surface layer has an applied adhesive layer selected from the group consisting of Ti and Cr.

9. The method of claim 1 in which the inked pattern is removed by ultraviolet light, heat, or wet chemical cleaning.

10. The method of claim 2 wherein the member comprises a cylinder with a glass surface.

* * * * *